United States Patent
Baik et al.

(10) Patent No.: US 7,906,785 B2
(45) Date of Patent: Mar. 15, 2011

(54) VERTICAL TYPE NITRIDE SEMICONDUCTOR LIGHT EMITTING DEVICE AND METHOD OF MANUFACTURING THE SAME

(75) Inventors: Doo Go Baik, Kyungki-do (KR); Bang Won Oh, Kyungki-do (KR); Tae Jun Kim, Kyungki-do (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 785 days.

(21) Appl. No.: 11/585,212

(22) Filed: Oct. 24, 2006

(65) Prior Publication Data
US 2007/0145391 A1    Jun. 28, 2007

(30) Foreign Application Priority Data
Dec. 26, 2005   (KR) .................. 10-2005-0129350

(51) Int. Cl.
*H01L 33/00*    (2010.01)
(52) U.S. Cl. .............. 257/79; 257/94; 257/96; 257/103; 257/449; 257/E33.051
(58) Field of Classification Search .................. 257/79, 257/94, 96, 103, 449, 453
See application file for complete search history.

(56) References Cited

U.S. PATENT DOCUMENTS

| 6,936,864 | B2 | 8/2005 | Kondo | |
| 7,057,212 | B2* | 6/2006 | Kim et al. | 257/98 |
| 7,453,098 | B2* | 11/2008 | Lai et al. | 257/98 |
| 2006/0002442 | A1* | 1/2006 | Haberern et al. | 372/46.01 |

FOREIGN PATENT DOCUMENTS

| JP | 11-186600 | 7/1999 |
| JP | 2004-193338 | 7/2004 |

OTHER PUBLICATIONS

Japanese Office Action, w/ English translation thereof, issued in Japanese Patent Application No. JP 2006-298298772 dated Mar. 2, 2010.

* cited by examiner

*Primary Examiner* — Jerome Jackson, Jr.
*Assistant Examiner* — Dale Page
(74) *Attorney, Agent, or Firm* — McDermott Will & Emery LLP

(57) ABSTRACT

A vertical nitride semiconductor light emitting device and a manufacturing method thereof are provided. In the device, an ohmic contact layer, a p-type nitride semiconductor layer, an active layer, an n-type nitride semiconductor layer and an n-electrode are sequentially formed on a conductive substrate. At least one of a surface of the p-type nitride semiconductor layer contacting the ohmic contact layer and a surface of the n-type nitride layer contacting the n-electrode has a high resistance area of damaged nitride single crystal in a substantially central portion thereof. The high resistance area has a Schottky junction with at least one of the ohmic contact layer and the n-electrode.

6 Claims, 4 Drawing Sheets

(a)

(b)

VERTICAL TYPE NITRIDE SEMICONDUCTOR LIGHT EMITTING DEVICE AND METHOD OF MANUFACTURING THE SAME

CLAIM OF PRIORITY

This application claims the benefit of Korean Patent Application No. 2005-129350 filed on Dec. 26, 2005 in the Korean Intellectual Property Office, the disclosure of which is incorporated herein by reference.

BACKGROUND OF THE INVENTION

1. Field of the Invention

The present invention relates to a vertical nitride light emitting device, and more particularly, to a luminescent nitride semiconductor light emitting device greatly improved in current spreading effects.

2. Description of the Related Art

In general, a group III-V semiconductor light emitting device is made of a semiconductor material having a composition expressed by $Al_xIn_yGa_{(1-x-y)}N$, where $0 \leq x \leq 1$, $0 \leq y \leq 1$ and $0 \leq x+y \leq 1$. The nitride semiconductor has its crystal grown on a limited type of growth substrate such as a sapphire substrate in view of lattice constant.

The sapphire substrate is electrically insulating so that the nitride semiconductor device has p- and n-electrodes formed on the same plane. But this structure disadvantageously causes current to be crowded laterally, thereby degrading current spreading effects. To overcome the problem associated with current spreading effects by a structural approach, a vertical light emitting device has been vigorously studied. Here, the vertical light emitting device has the two electrodes formed on opposed faces.

FIG. 1 illustrates an example of a conventional vertical nitride light emitting device.

As shown in FIG. 1, the nitride light emitting device 10 includes an ohmic contact layer 16, a p-type nitride semiconductor layer 14, an active layer 13 and an n-type nitride semiconductor layer 12 formed sequentially on a conductive substrate 18. On the n-type nitride semiconductor layer 12, an n-electrode 19 constructed of a transparent electrode layer 10a and an n-type bonding metal 19b is formed. Of course, a p-type bonding metal (not illustrated) may be formed underneath the conductive substrate 18.

The vertical nitride light emitting device 10 allows current to flow vertically, thereby improving current spreading effects. However, even in the vertical structure, disadvantageously current is crowded toward a central portion due to the location of the bonding metal 19b. Therefore, as shown in the light emitting device of FIG. 1, a current blocking layer 15 is additionally formed on a surface of the p-type nitride semiconductor layer in a central portion thereof, thereby spreading current uniformly across an overall area and enhancing light emitting efficiency as indicated with arrows.

The current blocking layer 15 is made of an insulating material of e.g., silicon dielectrics such as $SiO_2$. However this insulating material for the current blocking layer 15 exhibits relatively higher light absorption coefficient, thus causing light generated from the active layer not to be extracted but to be absorbed into the current blocking layer 15 with significant loss. This potentially reduces actual light emitting efficiency.

Therefore, in the art, there has been a demand for a novel method of improving current spreading effects without light loss in the vertical nitride light emitting device.

SUMMARY OF THE INVENTION

The present invention has been made to solve the foregoing problems of the prior art and therefore an object according to certain embodiments of the present invention is to provide a nitride semiconductor light emitting device in which nitride single crystal characteristics are changed locally to form a Schottky junction area, thereby improving current spreading effects, without employing a current spreading structure using a new insulating material with potential light loss.

Another object according to certain embodiments of the invention is to provide a method for manufacturing a nitride semiconductor light emitting device.

According to an aspect of the invention for realizing the object, there is provided a vertical nitride semiconductor device including an ohmic contact layer, a p-type nitride semiconductor layer, an active layer, an n-type nitride semiconductor layer and an n-electrode sequentially formed on a conductive substrate, wherein at least one of a surface of the p-type nitride semiconductor layer contacting the ohmic contact layer and a surface of the n-type nitride layer contacting the n-electrode has a high resistance area of damaged nitride single crystal in a substantially central portion thereof, the high resistance area having a Schottky junction with at least one of the ohmic contact layer and the n-electrode.

Preferably, the high resistance area has a contact resistance of at least $10^{-2} \Omega \cdot cm^2$ with respect to the ohmic contact layer or the n-electrode. Preferably, the high resistance area has a thickness smaller than that of the p-type or n-type nitride semiconductor layer where the high resistance area is formed. Also, preferably, the high resistance area represents 10% to 50% with respect to at least one of a total area of the surface of the p-type nitride semiconductor layer which is in the side of the ohmic contact layer and a total area of the surface of the n-type nitride semiconductor layer which is in the side of the n-electrode.

In a preferred embodiment, the high resistance area is formed on both the surface of the p-type nitride semiconductor layer contacting the ohmic contact layer and the surface of the n-type nitride semiconductor layer contacting the n-electrode. Optionally, the ohmic contact layer has high reflectivity.

The vertical nitride semiconductor device further comprises a high reflectivity metal layer between the ohmic contact layer and the conductive substrate, wherein the ohmic contact layer comprises a light transmissible material.

According to another aspect of the invention for realizing the object, there is provided a method for manufacturing a vertical nitride semiconductor device including an ohmic contact layer, a p-type nitride semiconductor layer, an active layer, an n-type nitride semiconductor layer and an n-electrode sequentially formed on a conductive substrate, the method comprising a step of selectively plasma-treating a substantially central portion of at least one of a surface of the p-type nitride semiconductor layer contacting the ohmic contact layer and a surface of the n-type nitride layer contacting the n-electrode to damage a corresponding portion of nitride single crystal thereof, thereby forming a high resistance area having a Schottky junction with at least one of the ohmic contact layer and the n-electrode.

Preferably, the high resistance area forming step is carried out by plasma generated from an inert gas. The inert gas comprises at least one selected from a group consisting of Ar, He, $N_2$, $CF_4$ and $H_2$.

The high resistance area according to the invention refers to a high resistance area with intentional impairment in crystallinity. As described above, the invention does not employ a high resistance layer made of an additional material. But at least one of a surface of the p-type nitride semiconductor layer or a surface of the n-type nitride semiconductor layer is plasma-treated in a central portion thereof to damage crystallinity, thereby forming the high resistance area having a Schottky junction

BRIEF DESCRIPTION OF THE DRAWINGS

The above and other objects, features and other advantages of the present invention will be more clearly understood from the following detailed description taken in conjunction with the accompanying drawings, in which:

FIG. 2a is a side sectional view illustrating a vertical nitride light emitting device according to an embodiment of the invention;

FIG. 2b is a top plan view cut along the line X-X' of FIG. 2a;

FIGS. 3a to 3e are cross-sectional views for explaining a method for manufacturing the vertical nitride light emitting device shown in FIG. 2a.

DETAILED DESCRIPTION OF THE PREFERRED EMBODIMENT

Preferred embodiments of the present invention will now be described in detail with reference to the accompanying drawings.

Figure 1:
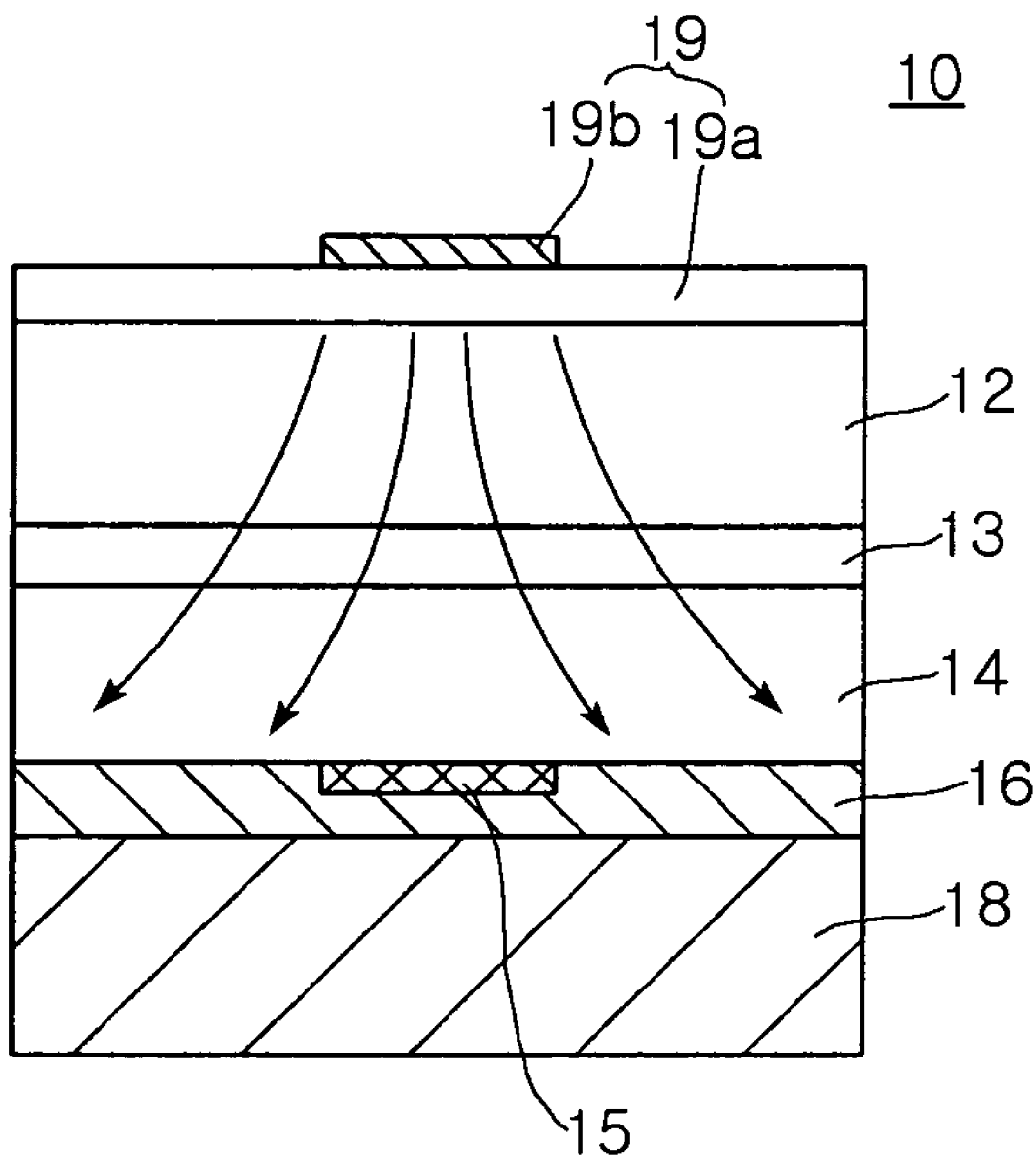
FIG. 1 is a side sectional view illustrating a conventional nitride light emitting device.
Figure 2:
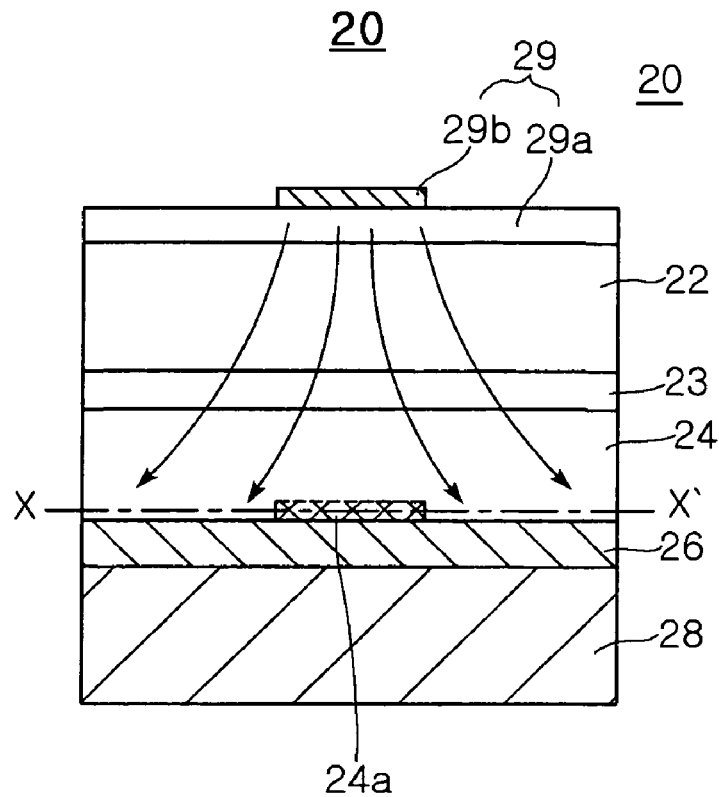
Figure 2:
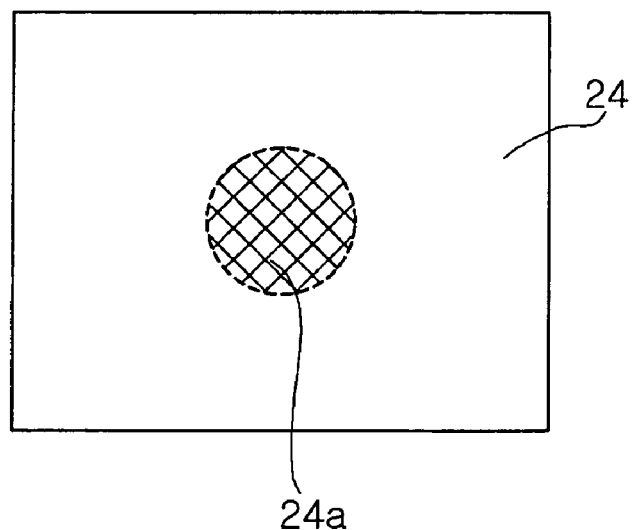

FIG. 2a is a side sectional view illustrating a vertical nitride light emitting device according to an embodiment of the invention, and FIG. 2b is a top plan view cut along the line X-X' of FIG. 2a.

Referring to FIG. 2a, the vertical nitride light emitting device 20 according to the invention includes an ohmic contact layer 26, a p-type nitride semiconductor layer 24, an active layer 23 and an n-type nitride semiconductor layer 22 formed sequentially on a conductive substrate 28.

The conductive substrate 28 is configured as a conductive adhesive layer or separately attached via thermo-compression. Alternatively, the conductive substrate 28 may be a metal layer formed via plating. The ohmic contact layer 26 is made of a material for forming an ohmic contact with the p-type nitride semiconductor layer 24. In this embodiment, it is preferable that the ohmic contact layer 26 has high reflectivity so that more light is emitted toward a desired direction. The high reflectivity ohmic contact layer 26 is made of one selected from Ag, Ni, Al, Ph, Pd, Ir, Ru, Mg, Zn, Pt, Au and alloys thereof. Preferably, the high reflectivity ohmic contact layer 26 is made of one selected from a group consisting of Ni/Ag, Zn/Ag, Ni/Al, Zn/Al, Pd/Ag, Pd/Al, Ir/Ag. Ir/Au, Pt/Ag, Pt/Al and Ni/Ag/Pt. Moreover in a case where the high reflectivity ohmic contact layer includes Ag, a barrier metal layer (not illustrated) made of Ni or TiW may be formed to prevent current leakage resulting from migration of Ag. A p-side bonding metal (not illustrated) made of Cr/Au may be additionally disposed underneath the conductive substrate 28. An n-electrode 29 is constructed of a transparent electrode layer 29a and a bonding metal 29b formed on the n-type nitride semiconductor layer 22.

In this embodiment, as shown in FIG. 2b, a high resistance area 24a is formed on a surface of the p-type nitride semiconductor layer 24 contacting the ohmic contact layer 26 in a substantially central portion thereof. Preferably, the high resistance area 24a is damaged in its crystal so as to have a contact resistance of at least $10^{-2}\Omega\cdot cm^2$ with respect to the ohmic contact layer or the n-electrode.

A single crystal of the p-type nitride layer 24 is impaired by plasma treatment to form the high resistance area 24a according to the invention. Unlike other areas, the high resistant area 24a forms a Schottky bonding, not an ohmic contact with the ohmic contact layer 26. Therefore, in practice, the high resistance area 24a obstructs current flow in the same manner as a current blocking layer made of an insulating material. This accordingly allows current to spread uniformly across the light emitting structure and even to the outer periphery thereof.

The high resistance area 24a is increased in its resistance by only damage to the single crystal but equal in optical properties to the p-type nitride semiconductor layer, thereby advantageously preventing light loss resulting from light absorption.

The high resistance area 24a of the invention prevents current from being crowded in a central portion thereof, thereby serving to uniformly spread current. Here, the high resistance area 24a is formed to an adequate size so as not to limit a current continuity area excessively. Preferably, the high resistance area 24a represents 10% to 50% with respect to a total area of the surface of the p-type nitride semiconductor layer 24, which is in the side of the ohmic contact layer 26.

FIGS. 3a to 3e are cross-sectional views for explaining a method for manufacturing the light emitting device shown in FIG. 2a.

Figure 3:
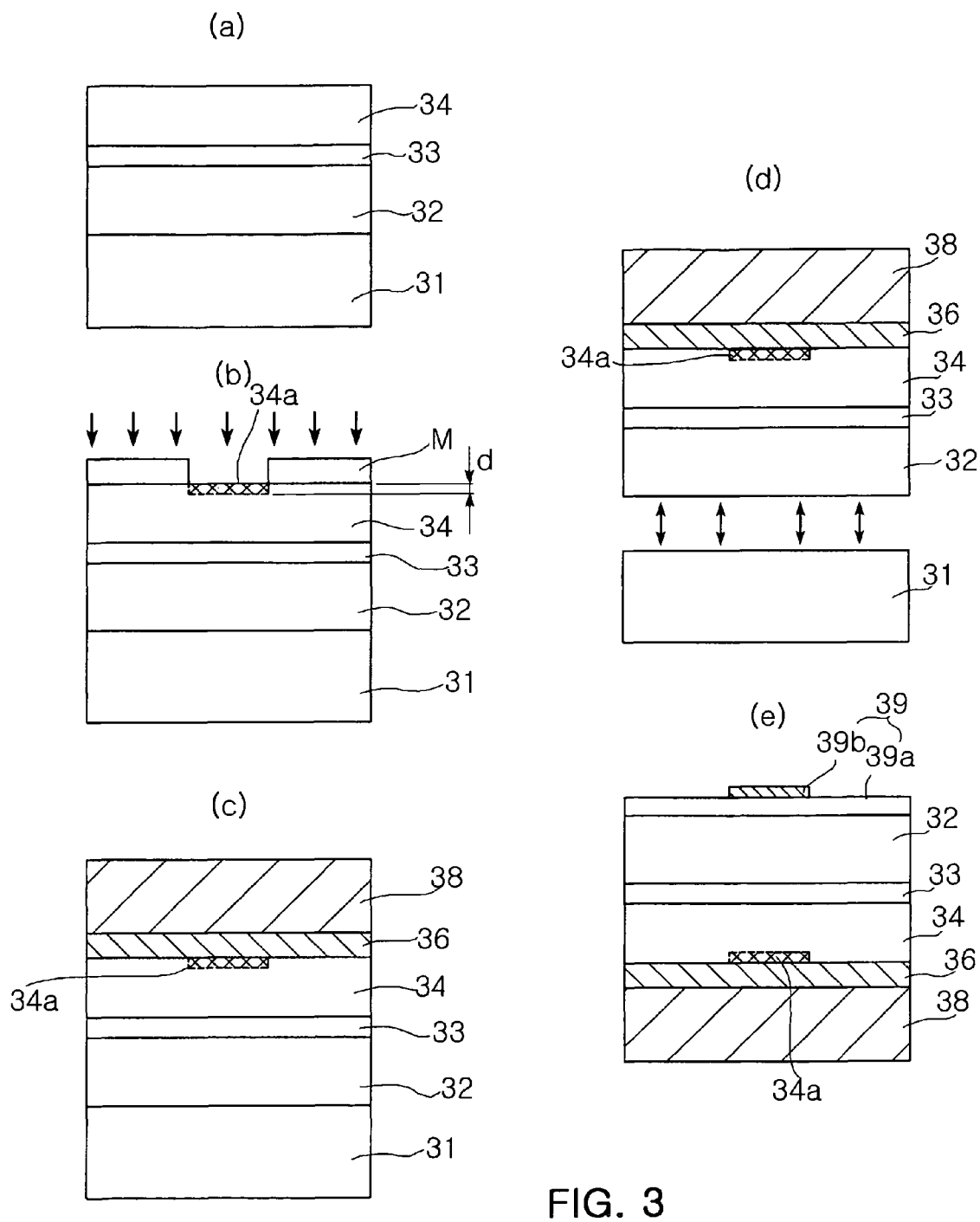

As shown in FIG. 3a, in manufacturing the vertical nitride light emitting device of the invention, first, an n-type nitride semiconductor layer 32, an active layer 33 and a p-type nitride semiconductor layer 34 are sequentially formed on a substrate for growing a nitride single crystal 31 such as a sapphire substrate.

Then, as shown in FIG. 3b, the p-type nitride semiconductor layer 34 is opened in a central portion thereof to form a mask, thereby blocking current. Then a single crystal is intentionally impaired via plasma to form a high resistance area 34a. To prevent unnecessary reaction in the process of plasma treatment, preferably, plasma generated from an inert gas is employed. The inert gas is selected from a group consisting of Ar, He, $N_2$, $CF_4$ and $H_2$. Preferably, the high resistance area 34a has a thickness d smaller than that of the p-type nitride semiconductor layer 34 so that the active layer 33 is left undamaged. More preferably, the high resistance area is formed to a thickness of 10 Å to 1000 Å. The thickness less than 10 Å does not yield sufficient current spreading effects. The thickness in excess of 1000 Å unnecessarily wastes the plasma treatment process without additional current blocking effects.

Next, as shown in FIG. 3c, a high reflectivity ohmic contact layer 36 and a conductive substrate 38 are sequentially disposed on the p-type nitride semiconductor layer 34 where the high resistance area 34 is formed. The ohmic contact layer 36 forms a normal ohmic contact on a surface contacting the p-type nitride semiconductor layer 34 where the high resistance area 34a is not formed. On the other hand, the ohmic contact layer 36 forms a Schottky junction at an interface of the high resistance area 34a. Therefore, current is not crowded toward the central portion but spread uniformly even to the outer periphery of the light emitting device, thereby boosting light emitting efficiency. In order to obtain the conductive substrate 38, a seed layer (not illustrated) is formed and then plated to form a desired metal support layer. Alternatively, other bonding process is employed to attach a separate conductive substrate.

Thereafter, as shown in FIG. 3d, the growth substrate 31 is separated from the n-type nitride semiconductor layer 32. The growth substrate can be easily separated via a known laser lift off process by a person skilled in the art. Finally, as shown in FIG. 3e, a transparent electrode layer 39a and an n-type bonding metal 39b are formed on the n-type nitride semiconductor layer 32 separated to thereby complete the n-electrode 39. Of course, in the electrode forming process, a p-side bonding metal (not illustrated) may be additionally formed underneath the conductive substrate 38.

In this fashion, the surface of the p-type nitride semiconductor layer 34 contacting the ohmic contact layer 36 is plasma-treated in a central portion thereof to form the high resistance area 34a with the damaged single crystal. This allows current to spread uniformly in the light emitting structure without light loss.

In the embodiment just described, the high resistance area is formed on only the p-type nitride semiconductor layer. Alternatively, the high resistance area may be formed on a surface of the n-type nitride semiconductor layer contacting the n-electrode. Of course, the high resistance area may be formed on both the surface of the p-type semiconductor layer and the surface of the n-type nitride semiconductor layer.

Figure 4:
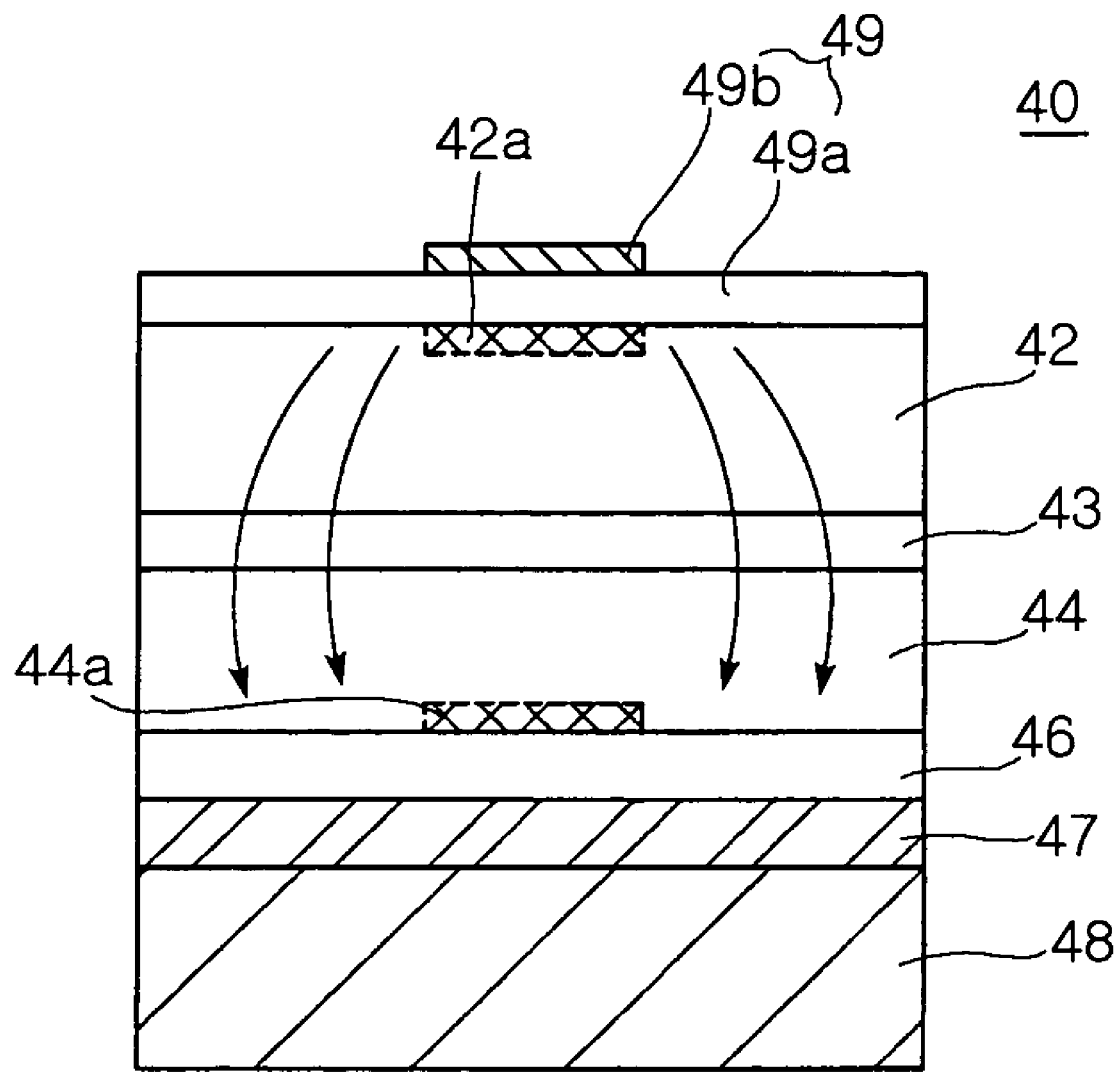
FIG. 4 is a side sectional view illustrating a vertical nitride light emitting device according to another embodiment of the invention.

FIG. 4 illustrates a vertical nitride light emitting device 40 having a high resistance area formed on both a surface of a p-type nitride semiconductor layer contacting an ohmic contact layer and a surface of an n-type nitride semiconductor layer contacting an n-electrode.

The vertical nitride light emitting device 40 of FIG. 4, in a similar manner to FIG. 2a, includes a conductive substrate 48 and a light emitting structure where a p-type nitride semiconductor layer 44, an active layer 43, and an n-type nitride semiconductor layer 42 are sequentially formed on the conductive substrate 48.

In this embodiment of the invention, a light transmissible ohmic contact layer 46 is formed on a p-type nitride semiconductor layer and a high reflectivity metal layer 47 is additionally formed. The light transmissible ohmic contact 46 may adopt a thermally treated Ni/Au double layer or a light transmissible conductive oxide layer of e.g., ITO. Optionally, a p-side bonding metal (not illustrated) made of Cr/Au may be formed underneath the conductive substrate 48. The n-electrode 49 is constructed of a transparent electrode layer 49a and an n-side bonding metal 49b formed on the n-type nitride semiconductor layer 42.

In this embodiment, high resistance areas 44a and 42b are formed on both the surface of the p-type nitride semiconductor layer 44 contacting the ohmic contact layer and the surface of the n-type nitride semiconductor layer 42 contacting the transparent electrode layer 49a, respectively. The high resistance areas 44a and 42a are formed in central portions, vertically opposing each other. As described above, to obtain the high resistance areas 44a and 42b 42a, a corresponding portion is selectively damaged in its crystal via plasma treatment to block current. Preferably, the high resistance areas 44a and 42a have a contact resistance of at least $10^{-2} \Omega \cdot cm^2$ with respect to the ohmic contact layer or the transparent electrode layer 49a.

These high resistance areas 44a and 42b with the damaged crystal form a Schottky junction with the ohmic contact layer 46 and the transparent electrode layer 49a. This ensures current to uniformly spread across the light emitting structure and even to an outer periphery as indicated with arrows.

As set forth above, the invention does not employ a current spreading structure using a new insulating material which potentially inflicts light loss. According to preferred embodiments of the invention, nitride single crystal characteristics are locally changed to form a Schottky junction area, thereby improving current spreading effects. This produces a high-efficiency nitride semiconductor light emitting device which allows current to spread uniformly without light loss.

While the present invention has been shown and described in connection with the preferred embodiments, it will be apparent to those skilled in the art that modifications and variations can be made without departing from the spirit and scope of the invention as defined by the appended claims.

What is claimed is:

1. A nitride semiconductor device comprising:
   an ohmic contact layer;
   a p-type nitride semiconductor layer;
   an active layer;
   an n-type nitride semiconductor layer; and
   an n-electrode on a conductive substrate,
   wherein the p-type nitride semiconductor layer has a high resistance area of damaged nitride single crystal extending from a substantially central portion of a surface of the p-type nitride semiconductor layer, the surface contacting the ohmic contact layer, and
   the n-type nitride layer contacting the n-electrode has another high resistance area of damaged nitride single crystal extending from a surface of the n-type nitride layer contacting the n-electrode in a substantially central portion thereof.

2. The nitride semiconductor device according to claim 1, wherein the high resistance area has a contact resistance of at least $10^{-2} \Omega \cdot cm^2$ with respect to the ohmic contact layer.

3. The nitride semiconductor device according to claim 1, wherein the high resistance area has a thickness smaller than that of the p-type nitride semiconductor layer where the high resistance area is formed.

4. The nitride semiconductor device according to claim 1, wherein the high resistance area represents 10% to 50% with respect to a total area of the surface of the p-type nitride semiconductor layer which is in the side of the ohmic contact layer.

5. The nitride semiconductor device according to claim 1, wherein the ohmic contact layer has high reflectivity.

6. The nitride semiconductor device according to claim 1, further comprising:
   a high reflectivity metal layer between the ohmic contact layer and the conductive substrate,
   wherein the ohmic contact layer comprises a light transmissible material.

* * * * *